United States Patent [19]

Tseng

[11] Patent Number: 5,677,216
[45] Date of Patent: Oct. 14, 1997

[54] METHOD OF MANUFACTURING A FLOATING GATE WITH HIGH GATE COUPLING RATIO

[75] Inventor: Horng-Huei Tseng, Hsinchu, Taiwan

[73] Assignee: Vanguard International Semiconductor Corporation, Hsinchu, Taiwan

[21] Appl. No.: 779,579

[22] Filed: Jan. 7, 1997

[51] Int. Cl.⁶ .................... H01L 21/265; H01L 21/8247
[52] U.S. Cl. .................... 437/43; 437/52; 437/186
[58] Field of Search .................... 437/43, 48, 52, 437/186

[56] References Cited

U.S. PATENT DOCUMENTS 5,304,505   4/1994   Hazani ........................... 437/52
5,543,339   8/1996   Roth et al. ...................... 437/43

*Primary Examiner*—John Niebling
*Assistant Examiner*—Richard A. Booth
*Attorney, Agent, or Firm*—Christensen O'Connor Johnson & Kindness, PLLC

[57] ABSTRACT

The present invention is a method of manufacturing a floating gate with high gate coupling ratio for use in a EPROM and EEPROM. The gate coupling ratio is the ratio of the surface area of the inter-poly and the tunnel oxide. This invention utilizes a floating gate having a trench so as to increase the surface area of the inter-poly. Thus, a floating gate having high gate coupling ratio is achieved.

19 Claims, 5 Drawing Sheets

METHOD OF MANUFACTURING A FLOATING GATE WITH HIGH GATE COUPLING RATIO

FIELD OF THE INVENTION

The present invention relates to electrically erasable programmable read only memories (EEPROM) and, more particularly, to a method of forming a floating gate with high gate coupling ratio for use in a EEPROM.

BACKGROUND OF THE INVENTION

Toward the end of the 1980s, the semiconductor industry developed the electrically erasable PROM (EEPROM). The result was a new generation of memories targeted at the low cost, high density memory market. The term "flash" historically had been used to describe a mode of programming or erasing an entire memory array at one time. The flash memory is programmed by hot electron injection at the drain edge and erased by Fowler-Nordheim tunneling from the floating gate to the source.

Many flash memory manufacturers chose a thin oxide floating gate process to make an electrically erasable PROM. The basic cell consists of access transistors and a double polysilicon storage cell with a floating polysilicon gate isolated in silicon dioxide capacitively coupled to a second polysilicon control gate which is stacked above it. The storage transistor is programmed by Fowler-Nordheim tunneling of electrons through a thin oxide layer between the gate and the drain of the transistor. The thin tunneling oxide generally is about 10 nm or 100 angstroms. Unfortunately, it is difficult to efficiently fabricate a thin tunnel oxide with a high electron injection efficiency and a large charge-to-breakdown ($Q_{bd}$) for the application of low voltage memories.

However, if the gate coupling ratio is made to be high, the voltage bias can be lowered. The gate coupling ratio (GCR) is proportional to the ratio of the surface area of the inter-poly dielectric and the tunnel oxide. A high gate coupling ratio is desirable because a lower bias voltage is necessary to "write" to the floating gate. In conventional methods, a high GCR can be achieved by complicating the structure of the floating gate or enlarging the cell size. Unfortunately, complicating the structure of the floating gate will require additional masks, resulting in increased manufacturing costs. Enlarging the cell size will reduce circuit density. Therefore, conventional methods can not effectively solve the problems.

SUMMARY OF THE INVENTION

In accordance with the present invention, a method of manufacturing a floating gate with high gate coupling ratio for use in an EPROM or EEPROM is provided. The method comprises the steps of forming a tunnel oxide on a semiconductor substrate; forming a first polysilicon layer onto said tunnel oxide; forming a first dielectric layer on the first polysilicon; patterning and etching the first polysilicon layer and the first dielectric layer to form a polysilicon gate; patterning and etching the first dielectric layer to form narrower the first dielectric layer on the polysilicon gate; oxidizing said polysilicon gate to form a poly-oxide layer on said polysilicon gate not covered by said first dielectric layer; removing said first dielectric layer; etching back said polysilicon gate using said poly-oxide layer as a mask to form a trench in said polysilicon gate; removing said poly-oxide layer and said tunnel oxide not covered by said polysilicon gate; forming a second dielectric layer atop said polysilicon gate; forming a second polysilicon layer on said second dielectric layer; and patterning and etching said second polysilicon layer and said second dielectric layer to form a control gate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The method of forming a floating gate having a high gate coupling ratio described herein includes some process procedures that are well known in the art of semiconductor integrated circuit fabrication and, thus, need not be described in detail. For example, the various photolithographic and etching process for patterning a layer are very well known and, therefore, the various steps of these process are omitted.

Figure 1:
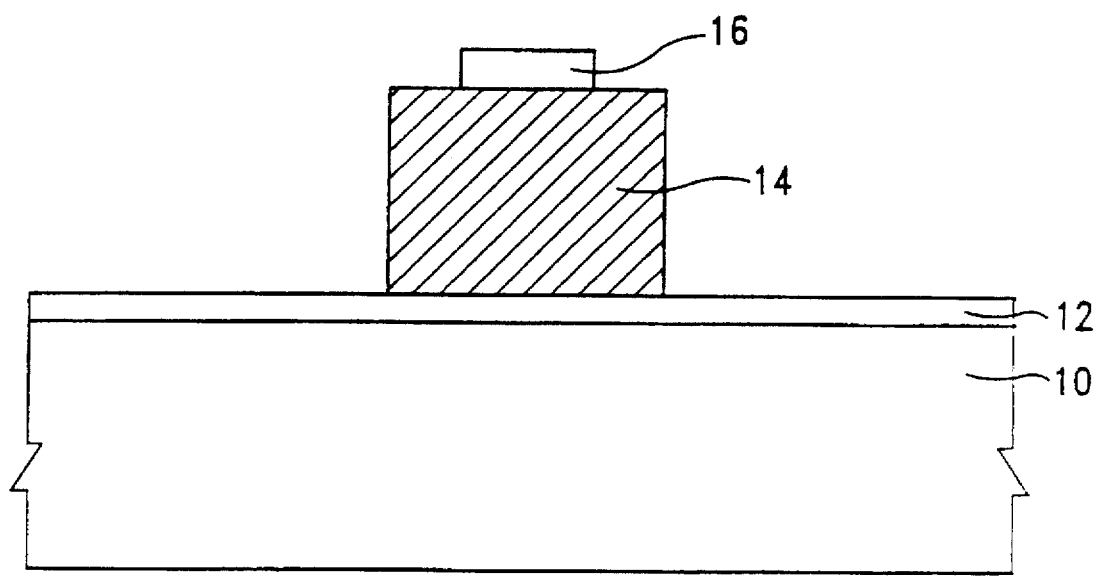
FIGS. 1A–1D and 1-6 are cross-sectional views of a semiconductor wafer illustrating various stages of forming a floating gate having a high gate coupling ratio according to the present invention.
Figure 1A:
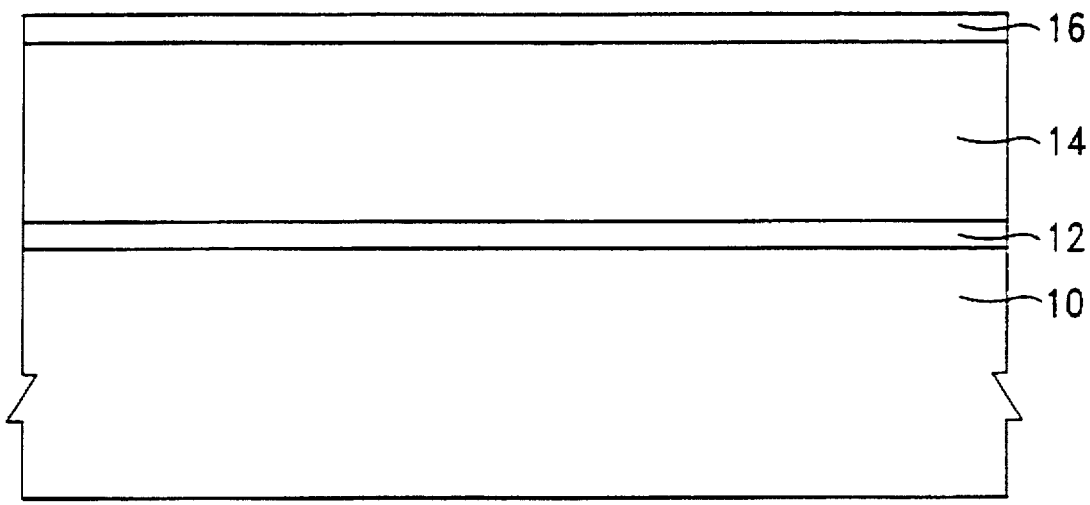

In accordance with the preferred embodiment of the present invention, the structure shown in FIG. 1A is formed using any suitable process. For example, a silicon oxide layer 12 is created atop a semiconductor substrate 10 to act as a tunnel oxide. In the preferred embodiment, the silicon oxide layer 12 is formed by using an oxygen-steam ambient, at a temperature between about 850° to 1000° C. Alternatively, the tunnel oxide may be formed using other known oxide chemical compositions and procedures. By controlling the pressure and time at which the oxygen-steam ambient is exposed to the substrate, the thickness of the silicon oxide layer 12 can be easily controlled. In the preferred embodiment, the thickness of the silicon oxide layer is approximately 50–200 angstroms.

After the silicon oxide layer 12 is formed, a first polysilicon layer 14 is formed over the silicon oxide 12. In this embodiment, the first polysilicon layer 14 is formed by using conventional chemical vapor deposition (CVD) techniques. It can be appreciated that other methods of depositing the first polysilicon layer 14 can be used. The thickness of the first polysilicon layer 14 is preferably about 2000–4000 angstroms. Next, a nitride layer 16 is deposited atop the first polysilicon layer 14. In this embodiment, the nitride layer 16 can be formed by any suitable process. For example, the nitride layer 16 is deposited by using conventional chemical vapor deposition process. The thickness of the nitride layer 16 is preferred approximately 200–800 angstroms.

Figure 1B:
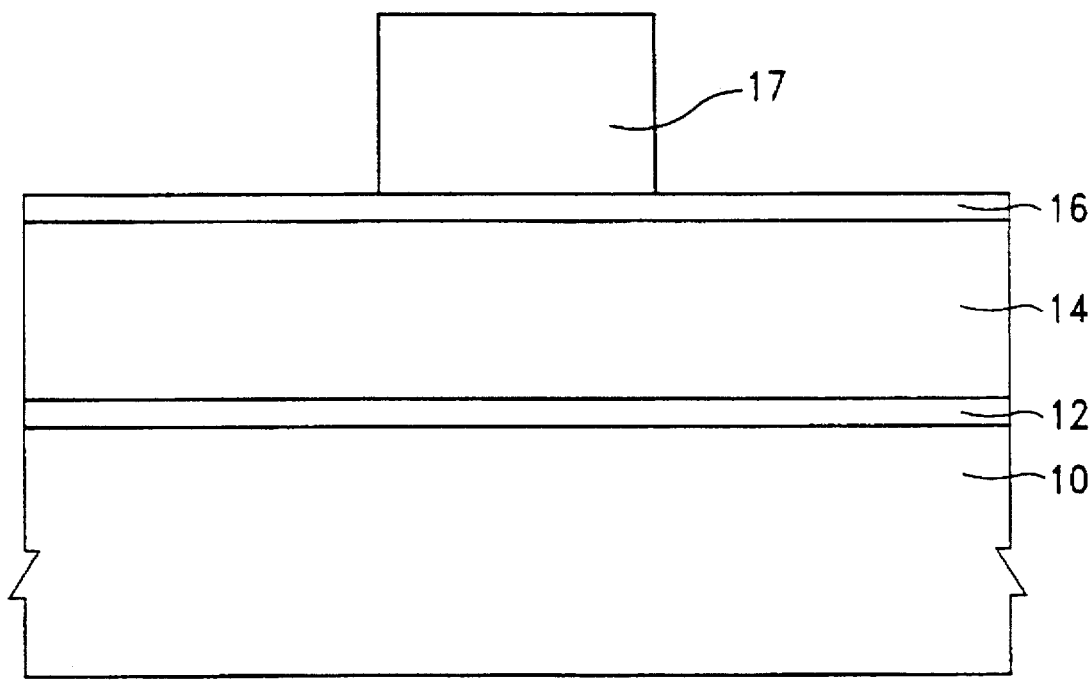
Figure 1C:
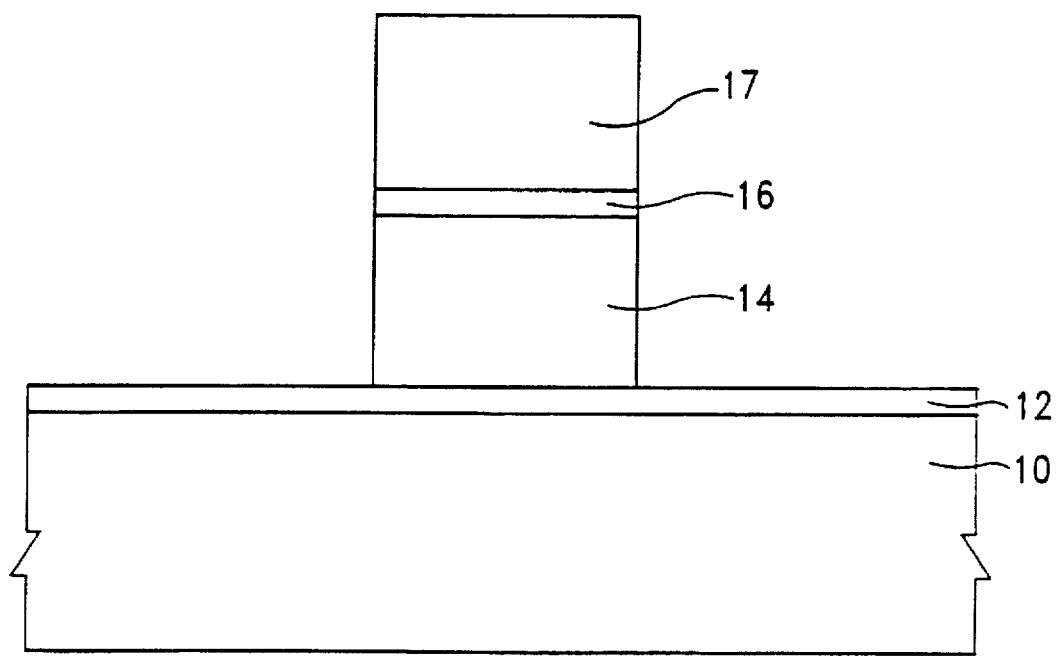

A patterned photoresist layer 17 is formed on the nitride layer 16 as shown in the FIG. 1B. Then, the nitride layer 16 and the first polysilicon layer 14 uncovered by the patterned photoresist layer 17 are removed to form a floating gate. In this embodiment, a standard reactive ion etching process is performed, using the silicon oxide layer 12 as an end-point of the etching process.

Figure 1D:
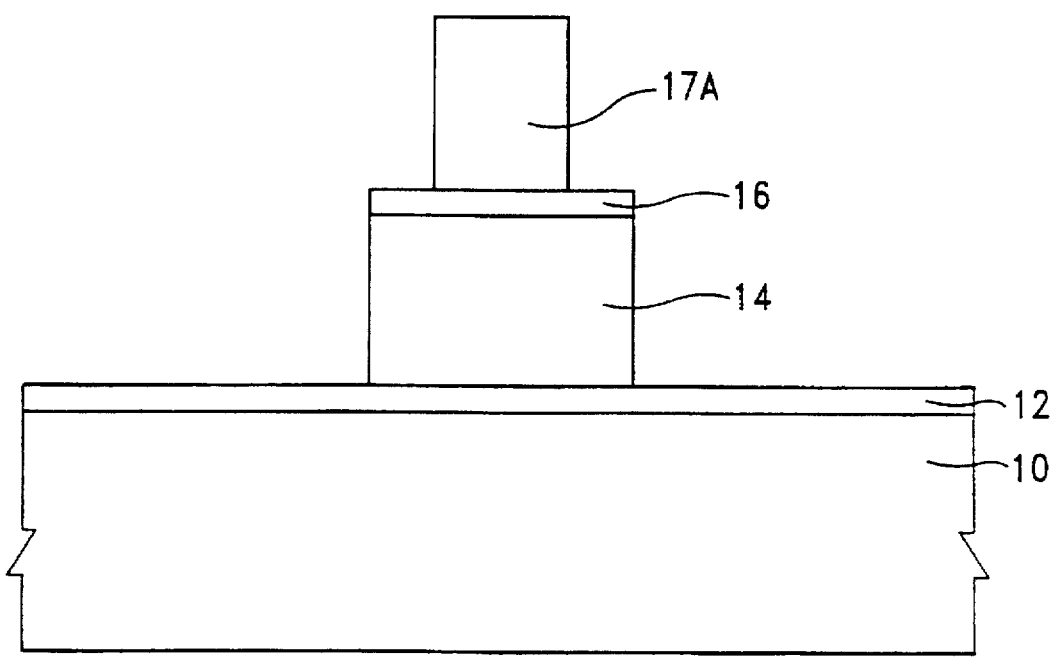

Turning to the FIG. 1D, the lateral photoresist layer 17 is etched to form the photoresist layer 17A. In this embodiment, An oxygen plasma process is performed in the lateral etch of the photoresist layer 17. This oxygen plasma is controlled by time mode. Then, the nitride layer 16 uncovered by the photoresist layer 17 is removed. In this embodiment, a reactive ion etching process is performed to etch the nitride layer 16 uncovered by the photoresist layer 17A. The first polysilicon layer 14 serves as an end-points of the etching process. The photoresist layer 17A is then removed by well-known process. The resulting structure is shown in FIG. 1.

Figure 2:
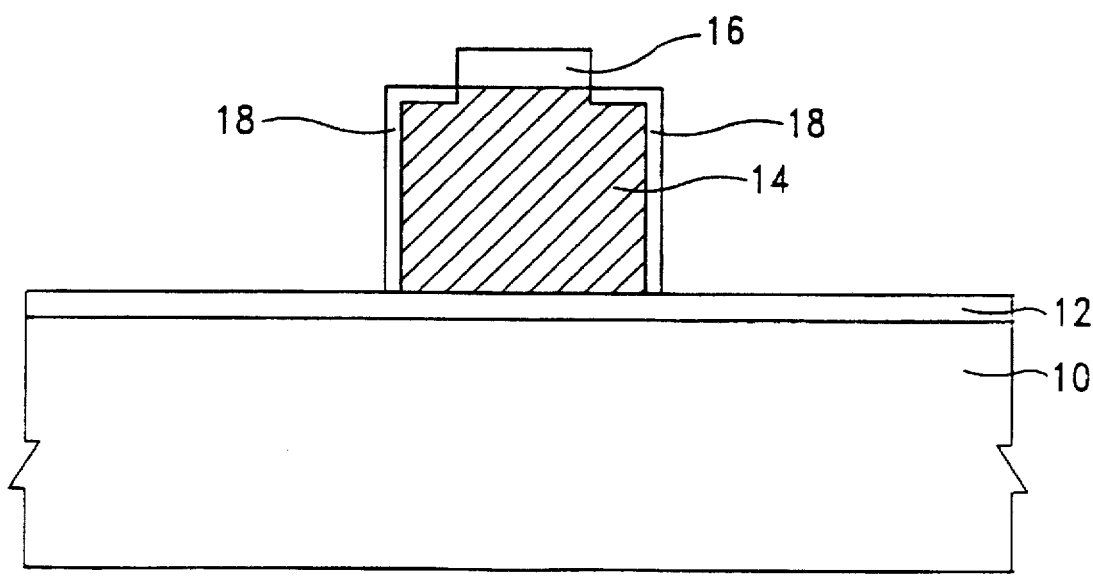

Referring next to the FIG. 2, a poly-oxide layer 18 is formed on the floating gate 14 not covered by the nitride layer 16. In this embodiment, a suitable oxidation method is performed to oxidize the surface of the floating gate to form a poly-oxide layer 18. For example, the poly-oxide layer 18 may be formed by using a dry oxidation method. The dry oxidation method is performed in an oxygen-vapor ambient, at a temperature between about 700° to 900° C. In the preferred embodiment, the thickness of the poly-oxide layer 18 is about 200-400 angstroms.

Figure 3:
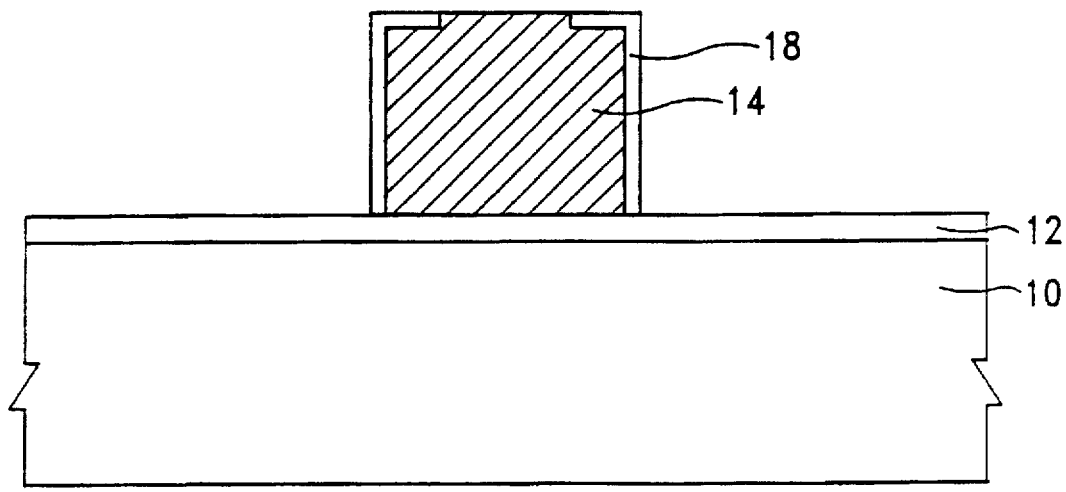

Next, an etching process is performed to remove the nitride layer 16. In this embodiment, the etching process is performed by any suitable etching process. For example, etching the nitride layer 16 may be performed by using a plasma etching process. A wet etching process using $H_3PO_4$ solution may also be performed to etch the nitride layer 16. The resulting structure is shown in the FIG. 3.

Figure 4:
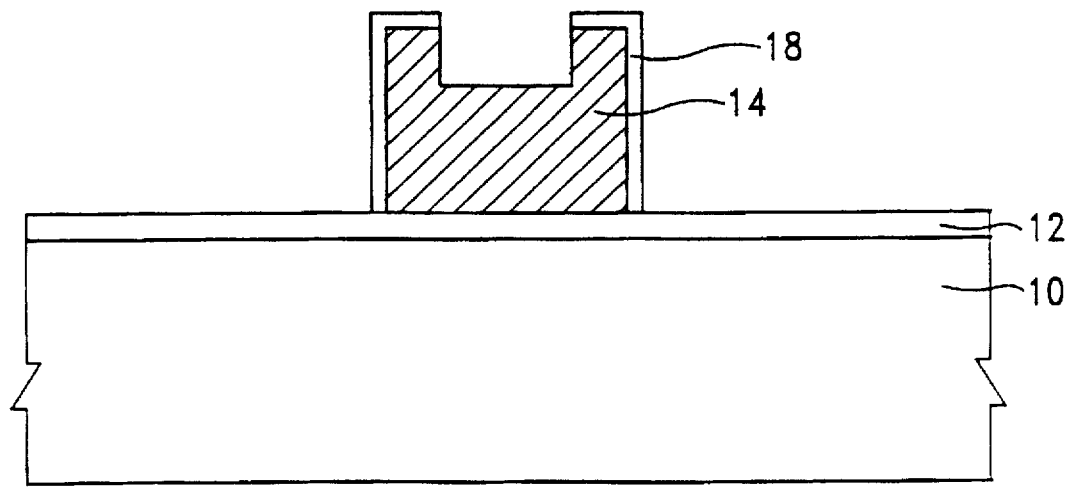

Now turning to FIG. 4, a trench is formed in the floating gate 14. Preferably, a reactive ion etching process is performed to etch back the floating gate 14 to form the trench. The poly-oxide layer 18 serves as a mask. The reactive ion etching process is performed using time mode control. In this embodiment, the depth of the trench is preferably about 1000-3000 angstroms. The resulting structure is known as a "crown-shaped" floating gate.

Figure 5:
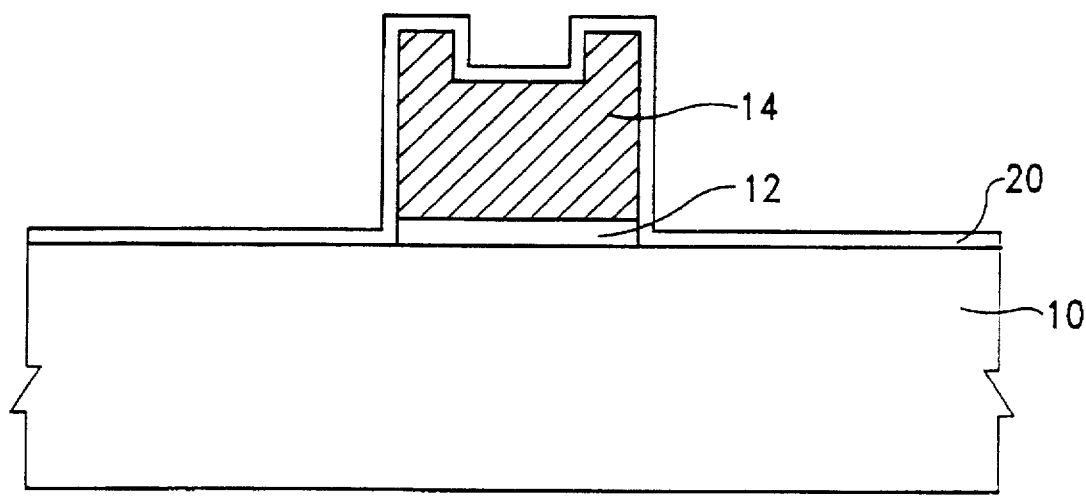

Next, an etching process is performed to remove the poly-oxide layer 18 and the tunnel oxide layer 12 not covered by the floating gate 14. In the preferred embodiment, the etching process can be any suitable etching process such as wet etch or dry etch. Next, an inter-poly dielectric layer 20 is then formed atop the floating gate 14 and on the substrate 10. In this embodiment, the inter-poly dielectric layer 20 can be any kind of oxide layer such as silicon dioxide layer, oxynitride, or nitride layer. Preferably, the inter-poly dielectric layer 20 has a thickness of between 20 to 150 angstroms. The resulting structure is shown in FIG. 5.

Figure 6:
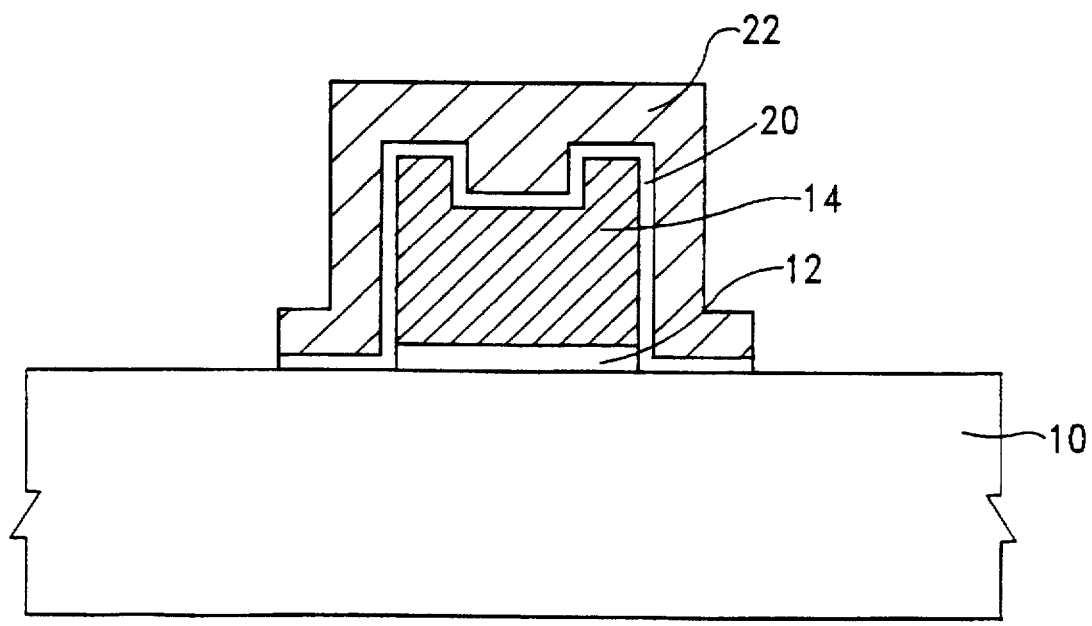

FIG. 6 shows a cross-sectional view of the next stage of one embodiment of the present invention. A second polysilicon layer 22 is deposited using any suitable process. In this embodiment, a conventional chemical vapor deposition is performed to deposit the second polysilicon layer 22. The thickness of the second polysilicon layer 22 is about 1000-3000 angstroms. The second polysilicon layer 22 and the inter-poly dielectric layer 20 is patterned and etched to form a control gate 22. The patterning and etching steps are performed by using any suitable process. In this embodiment, the second polysilicon layer 22 is masked by a patterned photoresist (not shown). A conventional etching process is performed to remove the second polysilicon layer 22 and the inter-poly dielectric layer 20 which are not covered by the patterned photoresist.

Although specific embodiment has been illustrated and described, it will be obvious to those skilled in the art that various modifications may be made without departing from the which is intended to be limited solely by the appended claims.

The embodiments of the invention in which an exclusive property or privilege is claimed are defined as follows:

1. A method of forming a floating gate in an integrated circuit, the method comprising the steps of:

forming a tunnel oxide on a semiconductor substrate;

forming a first polysilicon layer onto said tunnel oxide;

forming a first dielectric layer on said first polysilicon layer;

patterning and etching said first polysilicon layer and said first dielectric layer to form a polysilicon gate;

patterning and etching said first dielectric layer to form said first dielectric layer narrower than said polysilicon gate;

oxidizing said polysilicon gate to form a poly-oxide layer on said polysilicon gate not covered by said first dielectric layer;

removing said first dielectric layer;

etching back said polysilicon gate using said poly-oxide layer as a mask to form a trench in said polysilicon gate;

removing said poly-oxide layer and said tunnel oxide not covered by said polysilicon gate;

forming a second dielectric layer atop said polysilicon gate;

forming a second polysilicon layer on said second dielectric layer; and patterning and etching said second polysilicon layer and said second dielectric layer to form a control gate.

2. The method according to claim 1, wherein said tunnel oxide is silicon dioxide.

3. The method according to claim 1, wherein said tunnel oxide has a thickness in a range of 50 angstroms to 200 angstroms.

4. The method according to claim 1, wherein said first polysilicon layer has a thickness in a range of 2000 angstroms to 4000 angstroms.

5. The method according to claim 1, wherein said polysilicon gate serves as a floating gate.

6. The method according to claim 1, wherein said first dielectric layer is nitride.

7. The method according to claim 1, wherein said first dielectric layer has a thickness of a range of 300 angstroms to 800 angstroms.

8. The method according to claim 1, wherein said poly-oxide layer has a thickness of a range of 200 angstroms to 400 angstroms.

9. The method according to claim 1, wherein said removing said first dielectric layer is done by using a plasma etching process.

10. The method according to claim 1, wherein said removing said first dielectric layer is done by using a wet etching process with a $H_3PO_4$ solution.

11. The method according to claim 1, wherein said etching back said polysilicon gate is done by using a reactive ion etching process.

12. The method according to claim 1, wherein said trench has a depth of approximately 1000-3000 angstroms.

13. The method according to claim 1, wherein said removing said poly-oxide layer is done by using an etching process.

14. The method according to claim 1, wherein said second dielectric layer serves as an inter-poly dielectric layer.

15. The method according to claim 1, wherein said second dielectric layer has a thickness in a range of 20 angstroms to 150 angstroms.

16. The method according to claim 1, wherein said second dielectric layer is selected from the group consisting of a silicon dioxide, oxynitride and nitride layer.

17. The method according to claim 1, wherein said second polysilicon layer has a thickness in a range of 1000 angstroms to 2000 angstroms.

18. A method of forming a floating gate in an integrated circuit, the method comprising the steps of:
   forming a tunnel oxide on a semiconductor substrate;
   forming a first polysilicon layer onto said tunnel oxide;
   forming a nitride layer atop a portion of said first polysilicon layer;
   patterning and etching said first polysilicon layer and said nitride layer to form a polysilicon gate;
   patterning and etching said nitride layer to form said nitride layer narrower than said polysilicon gate;
   oxidizing said polysilicon gate to form a poly-oxide layer on said polysilicon gate not covered by said nitride layer;
   removing said nitride layer;
   etching back said polysilicon gate using said poly-oxide layer as a mask to form a trench in said polysilicon gate;
   removing said poly-oxide layer and said tunnel oxide not covered by said polysilicon gate;
   forming an inter-poly dielectric layer atop said polysilicon gate;
   forming a second polysilicon layer on said inter-poly dielectric layer; and
   patterning and etching said second polysilicon layer and said inter-poly dielectric layer to form a control gate.

19. The method according to claim 18, wherein said polysilicon gate serves as a floating gate.

* * * * *